United States Patent [19]

Petri

[11] Patent Number: 5,668,329

[45] Date of Patent: Sep. 16, 1997

[54] SPURIOUS MODE MAP FOR DETF FORCE TRANSDUCER

[75] Inventor: Fred Petri, Snohomish, Wash.

[73] Assignee: Alliedsignal, Inc., Morristown, N.J.

[21] Appl. No.: 678,452

[22] Filed: Jul. 3, 1996

Related U.S. Application Data

[63] Continuation of Ser. No. 241,099, May 11, 1994, abandoned.

[51] Int. Cl.$^6$ .................................................. G01L 1/00
[52] U.S. Cl. ..................................................... 73/862.59
[58] Field of Search ..................... 73/862.59, DIG. 1, 73/DIG. 4

[56] References Cited

U.S. PATENT DOCUMENTS

| | | | |
|---|---|---|---|
| 4,372,173 | 2/1983 | EerNisse et al. . | |
| 4,535,638 | 8/1985 | EerNisse et al. | 73/DIG. 4 |
| 4,665,748 | 5/1987 | Peters . | |
| 4,724,351 | 2/1988 | EerNisse et al. . | |
| 4,901,580 | 2/1990 | Blake et al. | 73/DIG. 1 |
| 4,912,990 | 4/1990 | Norling . | |
| 5,095,763 | 3/1992 | Delatorre | 73/862.59 |

FOREIGN PATENT DOCUMENTS

| 9103716 | 3/1991 | WIPO | G01L 1/10 |
|---|---|---|---|

OTHER PUBLICATIONS

Paper on Finite–Element Analysis of A Quartz Digital Accelerometer by E.D. Reedy, Jr. and W.J. Kass/Ultrasonics Ferroelectrics, and Frequency Control, vol. 37, No. 5, Sep., 1990; 11 pages.

*Primary Examiner*—Ronald L. Biegel

[57] ABSTRACT

A double-ended tuning fork (DETF) is formed from two vibrating beams joined together at each end, having a thickness t, a width w, a length L and a vibrating beam length m. The dimensional ratios t/w and L/m for the DETF are selected according to a relatively more accurate spurious mode map based upon detailed finite element calculations at specific dimensional ratios for t/w and L/m. The results of the finite element analysis is fit by way of a lease-squared polynomial over the entire dimensional range of interest. The results of the finite element analysis for the spurious modes provides differences of up to fourteen percent (14%) relative to the spurious mode map based on simple beam theory. In addition, the spurious mode map in accordance with the present invention accounts for the use of symmetric outriggers in the base region of the DETF which increases the mechanical Q of the DETF.

12 Claims, 3 Drawing Sheets

5,668,329

SPURIOUS MODE MAP FOR DETF FORCE TRANSDUCER

This application is a continuation of Ser. No. 08/241,099 filed on May 11, 1994 now abandoned.

BACKGROUND OF THE INVENTION

1. Field of the Invention

The present invention relates to a double-ended tuning fork (DETF) and, more particularly, to DETFs used for force transducers whose dimensions are selected to avoid spurious modes of operation in order to increase the mechanical Q of the DETF.

2. Description of the Prior Art

Double-ended tuning forks (DETF) are known to be used in various transducers to measure force, acceleration, pressure and the like. Examples of such DETFs are disclosed in U.S. Pat. No. 4,912,990, hereby incorporated by reference. The DETFs used in such transducers are known to be made from a relatively rigid material, such as crystalline quartz, which provides a relatively high mechanical Q and relatively high sensitivity to axial force along the sensitive axis SA. Such DETFs are formed with a pair of spaced-apart, vibrating beams or tines, joined together at opposing ends. Transducers which utilize such DETFs normally include a pendulum or proof mass, connected to a casing by one or more flexures which enable the pendulum to rotate about a hinge axis HA, defined by the flexures. The DETF is normally connected between the casing and the pendulum in a direction generally perpendicular to the hinge axes HA to define a sensitive axis SA.

Excitation is normally applied to the DETF to cause the vibrating beams to vibrate at a resonant frequency when the pendulum is at rest. Forces applied along the sensitive axis SA cause the vibrating beams to go into either tension or compression, which changes the resonant frequency of vibration of the beams. This change in frequency, in turn, is used to measure the force applied along the sensitive axis SA.

A problem has been discovered relative to DETFs, especially those used in force transducers. In particular, such DETFs have been known to operate in various spurious modes which may develop over the operational range of the transducer. These spurious modes are known to lower the mechanical Q of the transducer, as well as cause a shift in frequency, and even stop the oscillation of the device at the desired natural resonant frequency.

Such spurious modes of operation are known to be associated with certain dimensional ratios of the DETF. In particular, the DETF is formed with a pair of spaced-apart, generally parallel vibrating beams, wherein each beam has a thickness t, a width w, a length L between fixed ends and a beam length m. As disclosed in U.S. Pat. No. 4,372,173, hereby incorporated by reference, certain values of the ratios t/w and L/m can result in spurious modes of operation. In order to avoid such spurious modes of operating, the '173 patent discloses a spurious mode map which graphically illustrates ranges of values for the ratios t/w and L/m in which certain spurious modes of operation can be avoided. Unfortunately, the spurious mode map disclosed in the '173 patent is based upon simple beam theory and is, thus, relatively inaccurate. In addition, the spurious mode map disclosed in the '173 patent does not account for symmetric outriggers in the base region of the DETF, which can increase the mechanical Q of the transducer.

SUMMARY OF THE INVENTION

It is an object of the present invention to provide a spurious mode map for a double-ended tuning fork (DETF) which solves various problems known in the prior art.

It is yet another object of the present invention to provide a relatively accurate spurious mode map for a DETF used as a force transducer.

It is yet another object of the present invention to provide a DETF whose dimensions are selected to avoid spurious modes of operation.

It is yet further object of the present invention to provide a spurious mode map based on finite element analysis.

Briefly, the present invention relates to a double-ended tuning fork formed from two vibrating beams joined together at each end, having a thickness t, a width w, a length L and a vibrating beam length m. The specific dimensional ratios t/w and L/m are selected according to a relatively more accurate spurious mode map based upon detailed finite element calculations at specific dimensional ratios for t/w and L/m. The results of the finite element analysis are fit by way of a least-squared polynomial over the entire dimensional range of interest. The results of the finite element analysis for the spurious modes provides differences of up to fourteen percent (14%) relative to the spurious mode map based on simple beam theory. In addition, the spurious mode map in accordance with the present invention accounts for the use of symmetric outriggers in the base region of the DETF which increases the mechanical Q of the transducer.

DESCRIPTION OF THE DRAWINGS

These and other objects of the present invention will be readily apparent upon reference to the following description and attached drawing, wherein.

DETAILED DESCRIPTION OF THE PREFERRED EMBODIMENT

The present invention relates to improved spurious mode map for a double-ended tuning fork (DETF) which provides a map of dimensional constraints which can result in lower mechanical Qs for the transducer or even result in no oscillation. The spurious mode map in accordance with the present invention is based on a finite element model analysis (FEM) which provides differences of up to 14% relative to other known spurious mode maps based on simple beam theory, such as the spurious mode map disclosed in U.S. Pat. No. 4,372,173.

Figure 1:
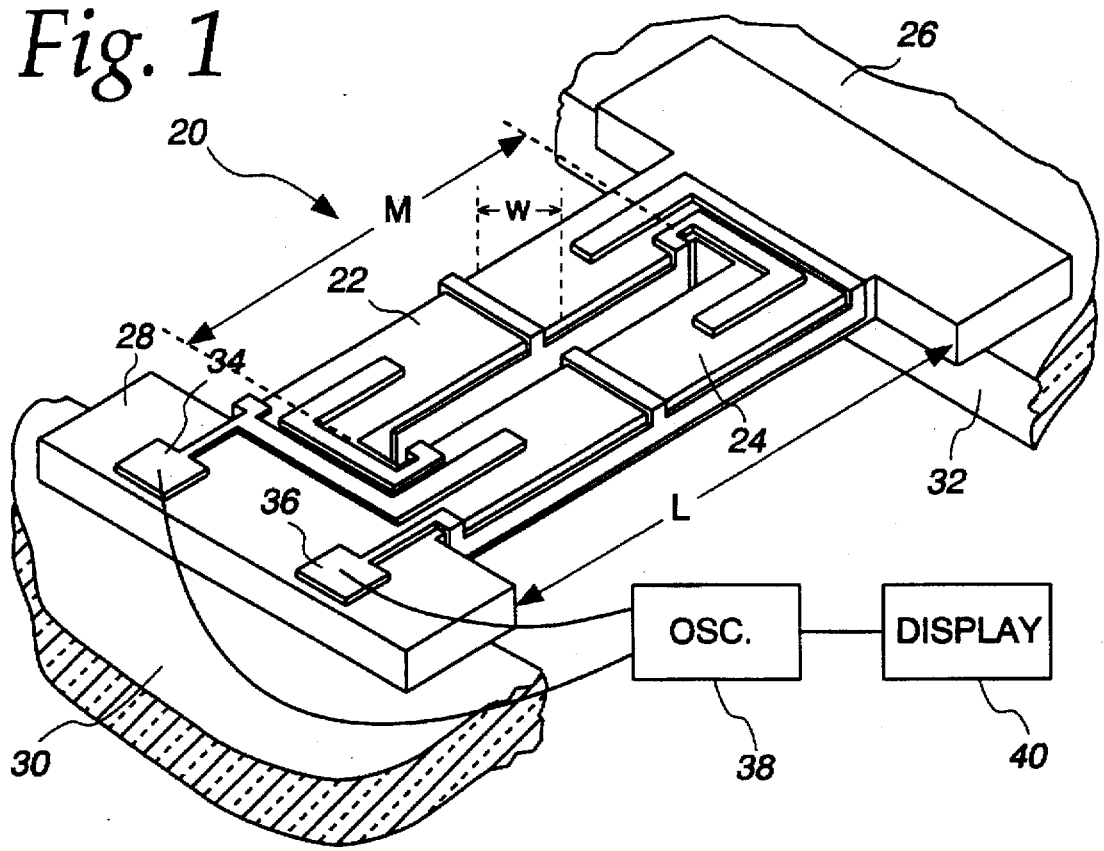
FIG. 1 is a perspective view of a double-ended tuning fork (DETF) in accordance with the present invention.

As mentioned above, the spurious mode map in accordance with the present invention is used to optimize the dimensional constraints of DETFs; particularly those used in force transducers to avoid spurious modes of operation. A typical DETF is shown in FIG. 1. The DETF, generally identified with the reference numeral 20, includes a pair of spaced apart, generally parallel vibrating beams or tines 22 and 24. The vibrating beams 22 and 24 are joined together at opposing ends by mounting pad portions 26 and 28. These mounting pad portions 26 and 28 are adapted to be rigidly secured to support surfaces 30 and 32; which form a portion of the force transducer.

The DETF 20 is configured to measure compression and tension forces along a direction generally parallel to the vibrating beams 22 and 24. A pair of electrodes 34 and 36 are disposed along the vibrating beams 22 and 24. The electrodes 34 and 36 are configured relative to the vibrating beams 22 and 24, and connected to an oscillator 38 to cause the vibrating beams 22 and 24 to vibrate 180° out-of-phase with respect to one another at a predetermined resonant frequency when no forces are applied along the axis parallel to the vibrating beams 22 and 24. When forces are applied along the axis parallel to the vibrating beams 22 and 24, the resonant frequency of the oscillator 38 varies and either increases or decreases, depending upon whether the force is a tension force or a compression force. By measuring the difference in frequency, for example, with the display 40, the force applied along the axis parallel to the vibrating beams 22 and 24 can be ascertained.

Figure 2:
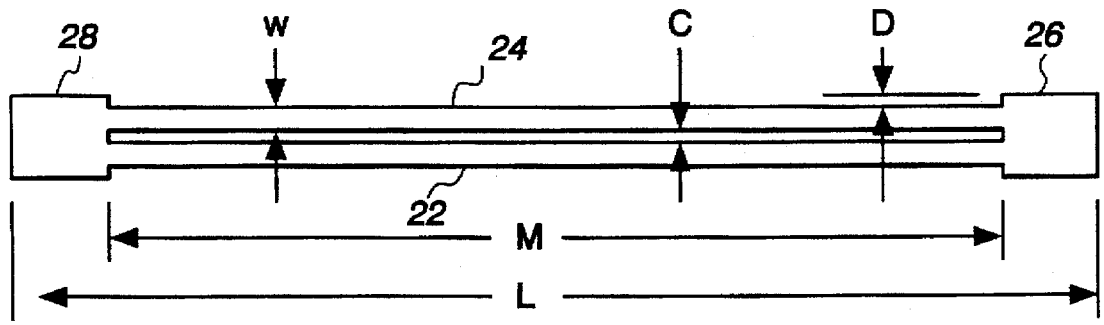
FIG. 2 is a top view of the DETF illustrated in FIG. 1.

As disclosed in U.S. Pat. No. 4,372,173 ("the '173 patent"), the performance of the DETF 20 is dependent upon dimensional constraints of the DETF. In particular, the '173 patent discloses that certain values of ratios of certain of the dimensions of the DETF 20 can cause the DETF to operate in a spurious mode and, thus, provide relatively inaccurate force measurements. FIG. 2 identifies the DETF 20 dimension of interest. In particular, the length of each of the vibrating beams 22 and 24 is identified as m. The width of each of the vibrating beams 22 and 24 is identified as w, while the distance between the vibrating beams 22 and 24 is identified as c. The distance between the edge of the mounting pad portions 26 and 28, and the beams 22 and 24 is identified as d, while the length of the entire DETF 20 is identified as L. The thickness of the DETF 20 is identified as t. The dimensions must be selected so that the ratio of t/w and L/m avoid interference with the fundamental vibration mode by other modes called spurious modes.

The present invention provides an improved spurious mode map based on detailed, finite element analysis at specific dimensional ratios and a least squared polynomial fit of the results of the finite element analysis over a relatively wide range of interest. As will be discussed in more detail below, the new spurious mode map is significantly different than the spurious mode map disclosed in the '173 patent based on simple beam theory and provides differences up to 14% in typical design areas.

The FEM analysis was performed using typical quartz DETF dimensions. In particular, these dimensions were as follows:

m=0.1474 in. (3.744 mm)
w=0.003937 in. (0.100 mm)
c=0.0019685 in. (0.05 mm)
d=0.00984252 in. (0.025 mm)

The thickness of the beam t was varied over a range of practical interest, for example:

$0.4 \leq t/w \leq 2.0$.

In addition, the overall length L was varied over a range between:

$1.0 \leq L/m \leq 1.8$.

In order to verify the accuracy of the FEM analysis, the initial solution was chosen corresponding to a fixed beam (i.e., L/m=1.0). The DETF 20 was modeled as solid brick elements, as formulated in SDRC-IDEAS software, version 6.0, available from *Structural Dynamics Research Corp.*, Milford, Ohio (hereby incorporated by reference), and compared to the beam theory solution disclosed in the '173 patent. More particularly, 8 node brick elements—relatively common in the art—were used to model the beam. The total number of elements used to model the beam was 600. The FEM analysis was performed using the above dimensions for the width w and length L of the beam; a modulus of crystalline quartz in the xy plane (E=11,805,420 psi); and a density of quartz of 0.0002476 slugs/in$^3$. A simultaneous vector iteration solution method was used to compute the eigenvalues and mode shapes using an interactive solution algorithm (described in detail in *Finite Element Modeling and Analysis with I-DEAS V*™, Volume 2, *Advanced Analysis, Structural Dynamics Corporation*, copyright 1990, hereby incorporated by reference). The fundamental planar frequency calculated by beam theory and the FEM solutions are provided below:

| METHOD | FUNDAMENTAL FREQUENCY |
| --- | --- |
| Beam Theory | 40,617.76 Hz/sec |
| FEM Method-8 Node Brick | 40,670.364 Hz/sec |

With the above analysis, the error for the 8 Node Brick FEM solution was +0.129% which is consistent with the FEM theory which predicts the linear 8 node brick to be slightly stiff in bending. The accuracy of the 8 node brick FEM solution was determined to be sufficient to perform the calculations of the DETF 20 varying the outrigger length and the thickness to width ratio of the vibrating beams 22 and 24.

Figure 3:
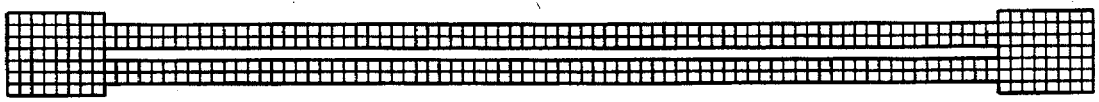
FIG. 3 is a graphical representation of the finite element model used to develop the spurious mode map in accordance with the present invention.

The DETF analysis was performed using the same number of elements for each of the vibrating beams 22 and 24 as was used in the fixed beam classical case discussed above. A typical FEM mesh is shown in FIG. 3. As illustrated therein, the end region was modeled using 7 elements laterally (i.e., X direction) and 7 elements longitudinally (i.e., Y direction). In all cases, two elements were used across the tine width and two elements across the thickness of the DETF. The first 15 modes were computed for all cases. These cases included the fundamental planar out-of-phase mode (f); the first normal in-phase mode ($f_{p1}$); the second normal in-phase mode ($f_{p2}$); the third normal in-phase mode ($f_{p3}$); the first normal out-of-phase mode ($f_{d1}$); and the second normal out-of-phase mode ($f_{d2}$).

At a particular length L to tine length m ratio (L/m=1.2), the thickness of the finite element was varied so that the thickness to tine width ratio became 0.4, 0.6, 0.8, 1.0, 1.2 and 1.6. A comparison of the actual frequencies computed for the t/w ratio of 1.0 is provided in Table I below.

TABLE I

| Mode | Frequency (Hz) Beam Theory Solution | Frequency (Hz) FEM Solution |
| --- | --- | --- |
| 1st normal in-phase | 28,221.06 | 30,759.92 |
| 1st normal out-of-phase | 40,638.33 | 37,743.05 |
| 1st in-plane, in-phase | 40,638.33 | 38,217.954 |
| 1st in-plane, out-of-phase | 40,638.33 | 38,966.66 |
| 2nd normal, in-phase | 77,743.9 | 83,066.37 |
| 2nd normal, out-of-phase | 111,951.32 | 103,211.62 |
| 2nd in-plane, in-phase | | 103,495.30 |
| 2nd in-plane, out-of-phase | | 106,949.7 |
| 3rd normal, in-phase | 152,546.28 | 159,679.67 |

The differences between the FEM solution and the beam theory solution range is approximately 4% to 9%; well above the expected FEM accuracy of better than 0.2%. The differences between the classical and FEM solutions are consistent with the limitations of the beam theory. For example, the first normal in-phase FEM solution is higher than the computed beam theory solution; easily attributed to the fact that the beam theory solution does not consider additional stiffening of the base region. In addition, the desired in-plane, out-of-phase mode FEM solution is lower than the computed beam solution, which can be attributed to the fact that the beam theory solution considers the tines fixed at their ends, while the FEM solution includes the flexing of the base region. Such errors tend to reinforce each other in the spurious mode map when the interference of the normal modes and the fundamental planar mode are considered.

A correcting factor (K) is computed by taking the ratios of the fundamental frequency to the various spurious mode frequencies calculated by both the FEM method and the beam solution. Examination of the variation of the K factor with the ratio t/w results in the conclusion that the variation is small and approximately linear with the ratio of t/w. Consequently, in order to perform a polynomial fit of the correcting factor, only three FEM solutions of t/w were chosen (0.6, 1.2, 1.6), while the L/m ratios of 1.0, 1.1, 1.2, 1.4, 1.6 and 1.8 were used. Table II below tabulates the computed K factor for the various spurious modes for L/m=1.4 over the t/w ratio being fit.

TABLE II

|  | t/w = 0.6 | t/w = 1.2 | t/w = 1.6 |
|---|---|---|---|
| $f/f_{p1}$ | 0.8532 | 0.8569 | 0.8599 |
| $f/f_{p2}$ | 0.8929 | 0.8993 | 0.9051 |
| $f/f_{p3}$ | 0.9246 | 0.9348 | 0.9446 |
| $f/f_{d1}$ | 1.0206 | 1.037 | 1.0476 |
| $f/f_{d2}$ | 1.0256 | 1.0494 | 1.0666 |

By defining the t/w ratio as A and the L/m ratio as B, the correcting factors K are fit to equation (1):

$$K_{f/fmn} = b_0 + b_1*B + b_2*B^2 + b_3*B^3 + a_1*A \quad (1)$$

Values of the a and b coefficients are determined for each $K_{f/fmn}$, where $f/f_{mn}$ are the fundamental to spurious mode ratios. In particular, the spurious modes, listed in Table II above, correspond to the first, second and third normal in-phase mode, and the first and second normal out-of-phase mode. The polynomial fit is obtained using standard state-of-the-art software (Mathcad Version 3.1, Mathsoft, Cambridge, Mass., hereby incorporated by reference) which performs a least square linear regression fit of the data. Table III below tabulates the calculated coefficients (a, b) for each of the spurious ratios.

TABLE III

|  | $b_0$ | $b_1$ | $b_2$ | $b_3$ | $a_1$ |
|---|---|---|---|---|---|
| $f/f_{p1}$ | 3.2668 | −4.6002 | 2.8947 | −0.6032 | 0.00778 |
| $f/f_{p2}$ | 3.5240 | −5.3422 | 3.5354 | −0.7636 | 0.01444 |
| $f/f_{p3}$ | 3.4836 | −5.4390 | 3.7417 | −0.8382 | 0.02411 |
| $f/f_{d1}$ | 0.6193 | 0.8130 | −0.5529 | 0.1234 | 0.02089 |
| $f/f_{d2}$ | 0.3764 | 1.2674 | −0.8342 | 0.1811 | 0.03232 |

The first order sensitivity of the DETF to load may be evaluated from equation (2) below:

$$S = 0.074/E*(m/w)^2*F/(t*w); \quad (2)$$

where F is the applied axial force and the remaining terms as previously defined. As is known in the art, the sensitivity S of the DETF can vary over the range +0.1 to −0.1 while still safely avoiding buckling and achieving frequency variations satisfactory for force measurements. The ratio of the various spurious modes are then expressed by the following equations:

$$f/f_{p1} = K_{f/fp1}(A,B) * \frac{B^2 * (1+S)}{A * (1 + S * B^2/A^2)} \quad (3)$$

$$2f/f_{p1} = 2K_{f/fp1}(A,B) * \frac{B^2 * (1+S)}{A * (1 + S * B^2/A^2)} \quad (4)$$

$$f/f_{p2} = K_{f/fp2}(A,B) * \frac{0.363 * B^2 * (1+S)}{A * (1 + 0.49 * S * (B^2/A^2))} \quad (5)$$

$$2f/f_{p2} = K_{f/fp2}(A,B) * \frac{0.726 * B^2 * (1+S)}{A * (1 + 0.49 * S * (B^2/A^2))} \quad (6)$$

$$f/f_{p3} = K_{f/fp3}(A,B) * \frac{0.185 * B^2 * (1+S)}{A * (1 + 0.27 * S * (B^2/A^2))} \quad (7)$$

$$2f/f_{p3} = K_{f/fp3}(A,B) * \frac{0.370 * B^2 * (1+S)}{A * (1 + 0.27 * S * (B^2/A^2))} \quad (8)$$

$$f/f_d = K_{f/fd}(A,B) * \frac{(1+S)}{A * (1 + S/A^2)} \quad (9)$$

$$2f/f_d = K_{f/fd}(A,B) * \frac{2 * (1+S)}{A * (1 + S/A^2)} \quad (10)$$

$$f/f_{2d} = K_{f/f2d}(A,B) * \frac{0.363 * (1+S)}{A * (1 + S/A^2)} \quad (11)$$

$$2f/f_{2d} = K_{f/f2d}(A,B) * \frac{0.726 * (1+S)}{A * (1 + S/A^2)} \quad (12)$$

Figure 4:
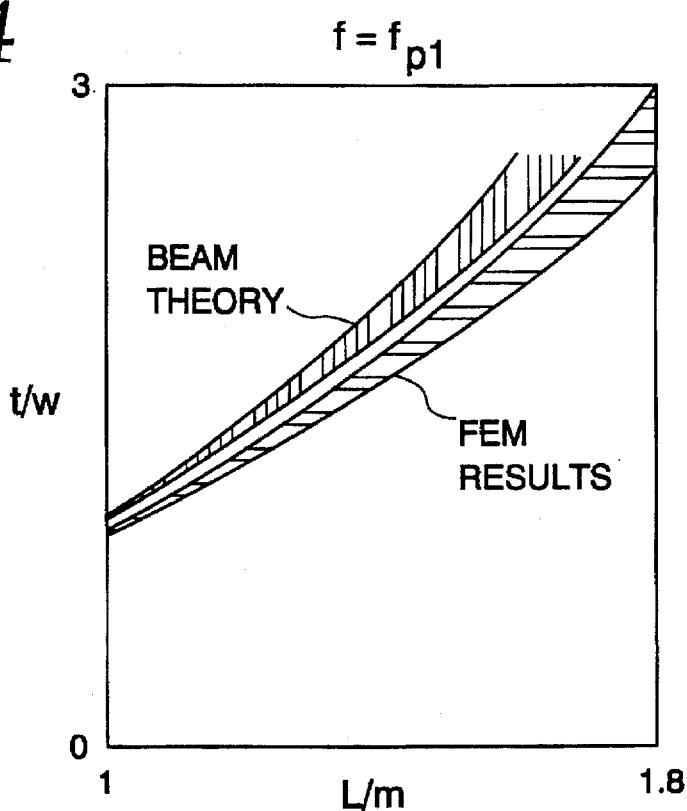
FIG. 4 is a graph illustrating the differences between the beam results and the finite dement results for one known mode of operation.
Figure 5:
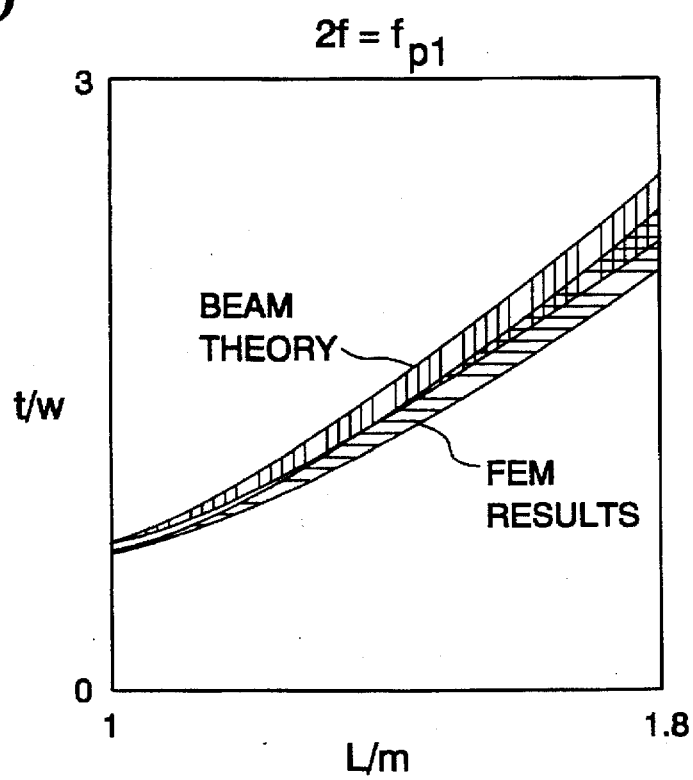
FIG. 5 is similar to FIG. 4 but for another known mode of operation.

In order to avoid spurious modes of operation, the DETF dimensions and in particular the ratios of t/w and L/m are selected so that the desired characteristic resonant frequency of the DETF and multiples thereof do not equal any of the spurious mode resonant frequencies for the operating range of interest. By equating the left-hand side of equations 13–22 to 1 and restricting S to be within +0.1 and −0.1, the regions of spurious modes can be determined. In particular, two of the relatively critical spurious mode zones (i.e., $f=f_{p1}$ and $2f=f_{p2}$) are shown in FIGS. 4 and 5, and compared against the beam theory solutions. At a ratio of L/m=1.0, the spurious mode zones converge to a value close to the beam theory solution; however, over the range of L/m=1.05 to 1.8, the FEM results lie below and almost completely outside the zone defined by classical beam theory.

Figure 6:
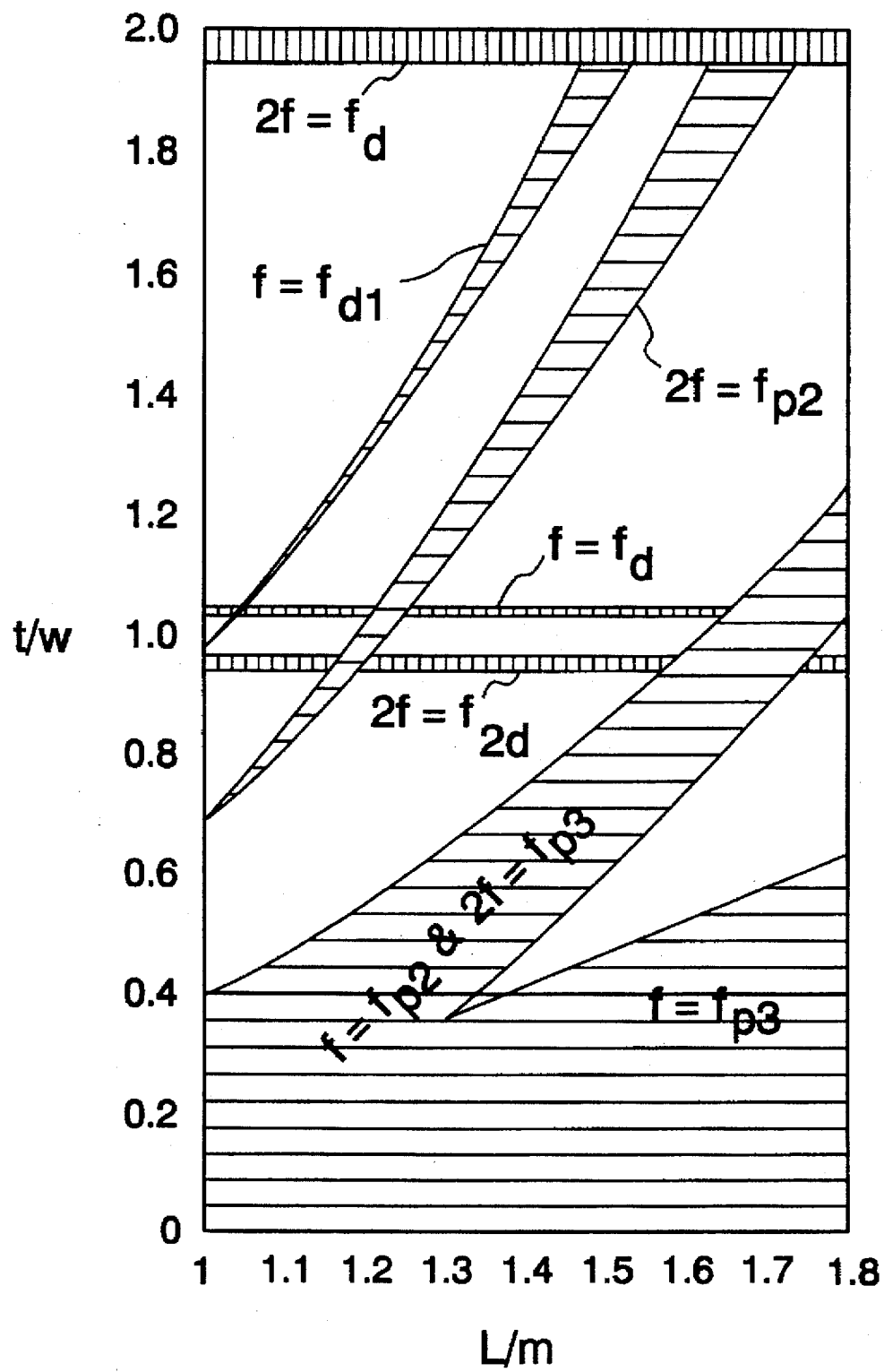
FIG. 6 is a graph of the spurious mode map in accordance with the present invention illustrating the ratio L/m on the horizontal axis and the ratio t/w on the vertical axis.

FIG. 6 illustrates the spurious mode map in accordance with the present invention based on the above-defined FEM solutions. The spurious mode map illustrated in FIG. 6 represents a relatively accurate spurious mode map for DETFs 20 (as shown in FIG. 1) with the region beyond the outriggers clamped to a fixed body. The vertical axis represents the t/w ratio while the horizontal axis represents the L/m ratio. The cross-hatched areas of the spurious mode map represent dimensional constraints and, in particular, values of the t/w and L/m ratios which result in spurious modes. The areas in FIG. 6 which are not cross-hatched illustrate values for the ratios t/w and L/m which are clear of spurious modes.

As discussed above, the spurious mode map (FIG. 6) in accordance with the present invention provides a significant improvement over the known spurious mode maps based on beam theory results, for example, as disclosed in U.S. Pat. No. 4,372,173. This improvement is expressed mathematically in equations 13–22 as follows:

$\Delta f/f_{p1} \neq 0$ and $f_{FEM}/f_{p1} = \dfrac{B^2 * (1+S)}{A * (1 + S * (B^2/A^2))} * K_{ff p1}(A,B) \neq 1$ (13)

$2\Delta f/f_{p1} \neq 0$ and $2f_{FEM}/f_{p1} = \dfrac{2 * B^2 * (1+S)}{A * (1 + S * (B^2/A2))} * K_{ff p1}(A,B) \neq 1$ (14)

$\Delta f/f_{p2} \neq 0$ and $f_{FEM}/f_{p2} = \dfrac{0.363 * B^2 * (1+S)}{A * (1 + 0.49 * S * (B^2/A^2))} * K_{ff p2}(A,B) \neq 1$ (15)

$2\Delta f/f_{p2} \neq 0$ and $2f_{FEM}/f_{p2} = \dfrac{0.726 * B^2 * (1+S)}{A * (1 + 0.49 * S * (B^2/A^2))} * K_{ff p2}(A,B) \neq 1$ (16)

$\Delta f/f_{p3} \neq 0$ and $f_{FEM}/f_{p3} = \dfrac{0.185 * B^2 * (1+S)}{A * (1 + 0.27 * S * (B^2/A^2))} * K_{ff p3}(A,B) \neq 1$ (17)

$2\Delta f/f_{p3} \neq 0$ and $2f_{FEM}/f_{p3} = \dfrac{0.370 * B^2 * (1+S)}{A * (1 + 0.27 * S * (B^2/A^2))} * K_{ff p3}(A,B) \neq 1$ (18)

$\Delta f/f_d \neq 0$ and $f_{FEM}/f_d = \dfrac{(1+S)}{A * (1 + S/A^2)} * K_{ff d}(A,B) \neq 1$ (19)

$2\Delta f/f_d \neq 0$ and $2f_{FEM}/f_d = \dfrac{2 * (1+S)}{A * (1 + S/A^2)} * K_{ff d}(A,B) \neq 1$ (20)

The following two modes are not defined in U.S. Pat. No. 4,372,173:

$$f/f_{2d} = \dfrac{0.363 * (1+S)}{A * (1 + S/A^2)} * K_{ff 2d}(A,B) \neq 1 \quad (21)$$

$$2f/f_{2d} = \dfrac{0.726 * (1+S)}{A * (1 + S/A^2)} * K_{ff 2d}(A,B) \neq 1 \quad (22)$$

The $\Delta f$ quantities represent the difference between the beam theory results (as expressed mathematically in U.S. Pat. No. 4,372,173 for each of the various modes) and the FEM results. These differences for each mode can be expressed mathematically in equations 23–55 as follows:

$$\Delta f/f_{p1} \neq 0 \quad (23)$$

$$\Delta f/f_{p1} = \dfrac{f_{FEM}}{f_{p1FEM}} - \dfrac{f_{BEAM}}{f_{p1BEAM}} \quad (24)$$

The quantity $f_{FEM}/f_{p1FEM}$ is defined in equation (3). The quantity $f_{BEAM}/f_{p1BEAM}$ is defined in U.S. Pat. No. 4,372,173 as:

$$f_{BEAM}/f_{p1BEAM} = \left[ \dfrac{wL^2 * (1+S)}{Lm^2(1 + S(L^2 w^2/m^2 t^2))} \right] \quad (25)$$

By substituting A for t/w and B for L/m, equation 25 can be rewritten as follows:

$$f_{BEAM}/f_{p1BEAM} = \left[ \dfrac{B^2 * (1+S)}{A * (1 + S(B^2/A^2))} \right] \quad (26)$$

Thus, $$\Delta f/f_{p1} = \left[ \dfrac{B^2 * (1+S)}{A * (1 + S(B^2/A^2))} \right] * [K_{ff p1} - 1] \quad (27)$$

In a similar manner, the differences between the beam results and the FEM results for various other modes can be expressed as follows:

$$2\Delta f/f_{p1} = \left[ \dfrac{2f_{FEM}}{f_{p1FEM}} \right] - \left[ \dfrac{2f_{BEAM}}{f_{p1BEAM}} \right] \quad (28)$$

The quantity $2f_{FEM}/f_{p2FEM}$ is defined in equation (4). The quantity $2f_{BEAM}/f_{p1BEAM}$ is defined in U.S. Pat. No. 4,372,173 as:

$$2f_{BEAM}/f_{p1BEAM} = \left[ \dfrac{2wL^2 * (1+S)}{tm^2 * (1 + S(L^2 w^2/m^2 t^2))} \right] \quad (29)$$

Substituting A=t/w and B=L/m, equation (29) can be rewritten as follows:

$$2f_{BEAM}/f_{p1BEAM} = \left[ \dfrac{2B^2 * (1+S)}{A * (1 + S(B^2/A^2))} \right] \quad (30)$$

Thus, $$2\Delta f/f_{p1} = \left[ \dfrac{2 * B^2 * (1+S)}{A * (1 + S(B^2/A^2))} \right] * [K_{ff p1}(A,B) - 1] \quad (31)$$

$$\Delta f/f_{p2} = \left[ \dfrac{f_{FEM}}{f_{p2FEM}} \right] - \left[ \dfrac{f_{BEAM}}{f_{p2BEAM}} \right] \quad (32)$$

The quantity $f_{FEM}/f_{p2FEM}$ is defined in equation (5). The quantity $2f_{BEAM}/f_{p2BEAM}$ is defined in U.S. Pat. No. 4,372,173 as follows:

$$f_{BEAM}/f_{p2BEAM} = \left[ \dfrac{0.363 w L^2 * (1+S)}{tm^2 * (1 + 0.49 S(L^2 w^2/m^2 t^2))} \right] \neq 1 \quad (33)$$

Substituting A=t/w and B=L/m into equation (33) yields:

$$f_{BEAM}/f_{p2BEAM} = \left[ \dfrac{0.363 * B^2 * (1+S)}{A * (1 + 0.49 S(B^2/A^2))} \right] \neq 1 \quad (34)$$

Thus, $$\Delta f/f_{p2} = \left[ \dfrac{0.363 * B^2 * (1+S)}{A * (1 + 0.49 * S(B^2/A^2))} \right] * [K_{ff p2}(A,B) - 1] \quad (35)$$

$$2\Delta f/f_{p2} = \left[ \dfrac{2f_{FEM}}{f_{p2FEM}} \right] - \left[ \dfrac{2f_{BEAM}}{f_{p2BEAM}} \right] \quad (36)$$

The quantity $2f_{FEM}/f_{p2FEM}$ is defined in equation (7). The quantity $2f_{BEAM}/f_{p2BEAM}$ is defined in U.S. Pat. No. 4,372,173 as follows:

$$2f_{BEAM}/f_{p2BEAM} = \left[ \dfrac{0.726 w L^2 * (1+S)}{tm^2 * (1 + 0.49 S(L^2 w^2/m^2 t^2))} \right] \neq 1 \quad (37)$$

Substituting A=t/w and B=L/m into equation (37) yields:

$$2f_{BEAM}/f_{p2BEAM} = \left[ \dfrac{0.726 * B^2 * (1+S)}{A * (1 + 0.49 S(B^2/A^2))} \right] \neq 1 \quad (38)$$

Thus, $$2\Delta f/f_{p2} = \left[ \frac{0.726 * B^2 * (1+S)}{A * (1+0.49 * S(B^2/A^2))} \right] * [K_{f/f_{p2}}(A,B) - 1] \quad (39)$$

$$\Delta f/f_{p3} = \left[ \frac{f_{FEM}}{f_{p3_{FEM}}} \right] - \left[ \frac{f_{BEAM}}{f_{p3_{BEAM}}} \right] \quad (40)$$

The quantity $f_{FEM}/f_{p3BEAM}$ is defined in equation (7). The quantity $f_{BEAM}/f_{p3BEAM}$ is defined in U.S. Pat. No. 4,372,173 as follows:

$$f_{BEAM}/f_{p3_{BEAM}} = \left[ \frac{0.185 * wL^2 * (1+S)}{tm^2 * (1+0.27 * S * (L^2w^2/m^2t^2))} \right] \neq 1 \quad (41)$$

Substituting A=t/w and B=L/m into equation (41) yields:

$$f_{BEAM}/f_{p3_{BEAM}} = \left[ \frac{0.185 * B^2 * (1+S)}{A * (1+0.27 * S * (B^2/A^2))} \right] \neq 1 \quad (42)$$

Thus, $$\Delta f/f_{p3} = \left[ \frac{0.185 * B^2 * (1+S)}{A * (1+0.27 * S(B^2/A^2))} \right] * [K_{f/f_{p3}}(A,B) - 1] \quad (43)$$

$$2\Delta f/f_{p3} = \left[ \frac{2f_{FEM}}{2f_{p3_{FEM}}} \right] - \left[ \frac{f_{BEAM}}{f_{p3_{BEAM}}} \right] \quad (44)$$

The quantity $2f_{FEM}/f_{p3FEM}$ is defined in equation (8). The quantity $2f_{BEAM}/f_{p3BEAM}$ is in U.S. Pat. No. 4,372,173 as follows:

$$2f_{BEAM}/f_{p3_{BEAM}} = \left[ \frac{0.370 * wL^2 * (1+S)}{tm^2 * (1+0.27 * S * (L^2w^2/m^2t^2))} \right] \neq 1 \quad (45)$$

Substituting A=t/w and B=L/m into equation (45) yields:

$$2f_{BEAM}/f_{p3_{BEAM}} = \left[ \frac{0.370 * B^2 * (1+S)}{A * (1+0.27 * S * (B^2/A^2))} \right] \neq 1 \quad (46)$$

Thus, $$2\Delta f/f_{p3} = \left[ \frac{0.370 * B^2 * (1+S)}{A * (1+0.27 * S(B^2/A^2))} \right] * [K_{f/f_{p3}}(A,B) - 1] \quad (47)$$

$$\Delta f/f_d = \left[ \frac{f_{FEM}}{f_{d_{FEM}}} \right] - \left[ \frac{f_{BEAM}}{f_{d_{BEAM}}} \right] \quad (48)$$

The quantity $f_{FEM}/f_{dFEM}$ is defined in equation (9). The quantity $f_{BEAM}/f_{dBEAM}$ is defined in U.S. Pat. No. 4,372,173 as follows:

$$f_{BEAM}/f_{d_{BEAM}} = \left[ \frac{w * (1+S)}{t * (1+S * (w^2/t^2))} \right] \neq 1 \quad (49)$$

Substituting A=t/w and B=L/m into equation (49) yields:

$$f_{BEAM}/f_{d_{BEAM}} = \left[ \frac{(1+S)}{A * (1+S/A^2)} \right] \neq 1 \quad (50)$$

Thus, $$\Delta f/f_d = \left[ \frac{(1+S)}{A * (1+S/A^2)} \right] * [K_{f/f_d}(A,B) - 1] \quad (51)$$

$$2\Delta f/f_d = \left[ \frac{2f_{FEM}}{f_{d_{FEM}}} \right] - \left[ \frac{2f_{BEAM}}{f_{d_{BEAM}}} \right] \quad (52)$$

The quantity $2f_{FEM}/f_{dFEM}$ is defined in equation (12). The quantity $2f_{BEAM}/f_{dBEAM}$ is defined in U.S. Pat. No. 4,372, 173 as follows:

$$2f_{BEAM}/f_{d_{BEAM}} = \left[ \frac{2w * (1+S)}{t * (1+S * (w^2/t^2))} \right] \neq 1 \quad (53)$$

Substituting A=t/w and B=L/m into equation (45) yields:

$$2f_{BEAM}/f_{d_{BEAM}} = \left[ \frac{2 * (1+S)}{A * (1+S/A^2)} \right] \neq 1 \quad (54)$$

Thus, $$2\Delta f/f_d = \left[ \frac{0.726 * (1+S)}{A * (1+S/A^2)} \right] * [K_{f/f_d}(A,B) - 1] \quad (55)$$

The improvement of the FEM based spurious mode map may be thus quantified by the equations above for values of the various K factors≠1.

Obviously, many modifications and variations of the present invention are possible in light of the above teachings. Thus, it is to be understood that within the scope of the appended claims, the invention may be practiced otherwise than as specifically designated above.

What is desired to be claimed by a Letters Patent is:

We claim:

1. A double ended tuning fork (DETF) comprising:
a pair of spaced apart vibrating beams, generally parallel and joined together at opposing ends, each beam having a thickness t, width w, length m, said DETF having a length L wherein the dimensions for t, w, m and L are selected using a finite element model to satisfy the following relationship:

$$f/f_{p1} = \left[ \frac{B^2 * (1+S)}{A * (1+S(B^2/A^2))} \right] * K_{f/f_{p1}} \neq 1$$

where $K_{f/f_{p1}}(A,B) \neq 1$; A=t/w; B=L/m and S is the sensitivity of the DETF over a predetermined operating range, and the coefficient K(A,B) is selected using a polynomial curve fitting technique to fit the following equation over a predetermined dimensional range:

$$K_{f/f_{mn}} = b_0 + b_1 * B + b_2 * B^2 + b_3 * B^3 + a_1 * A$$

where $K_{f/f_{mn}}$ are the fundamental to spurious mode ratios and the coefficients a and b are determined for each $K_{f/f_{mn}}$ over the predetermined dimensional range.

2. A double ended tuning fork (DETF) comprising:
a pair of spaced apart vibrating beams, generally parallel and joined together at opposing ends, each beam having a thickness t, width w, length m, said DETF having a length L wherein the dimensions for t, w, m and L are selected using a finite element model to satisfy the following relationship:

$$2f/f_{p1} = \left[ \frac{2 * B^2 * (1+S)}{A * (1+S(B^2/A^2))} \right] * K_{f/f_{p1}}(A,B) \neq 1$$

where $K_{f/f_{p1}}(A,B) \neq 1$; A=t/w; B=L/m and S is the sensitivity of the DETF over a predetermined operating range and the coefficient K(A,B) is selected using a polynomial curve fitting technique to fit the following equation over a predetermined dimensional range:

$$K_{f/f_{mn}} = b_0 + b_1 * B + b_2 * B^2 + b_3 * B^3 + a_1 * A$$

where $K_{f/f_{mn}}$ are the fundamental to spurious mode ratios and the coefficients a and b are determined for each $K_{f/f_{mn}}$ over the predetermined dimensional range.

3. A double ended tuning fork (DETF) comprising:

a pair of spaced apart vibrating beams, generally parallel and joined together at opposing ends, each beam having a thickness t, width w, length m, said DETF having a length L wherein the dimensions for t, w, m and L are selected using a finite element model to satisfy the following relationship:

$$f/f_{p2} = \left[ \frac{0.363 * B^2 * (1+S)}{A * (1 + 0.49 * S(B^2/A^2))} \right] * K_{f/fp2}(A,B) \neq 1$$

where $K_{f/fp2}(A,B) \neq 1$; $A=t/w$; $B=L/m$ and S is the sensitivity of the DETF over a predetermined operating range and the coefficient $K(A,B)$ is selected using a polynomial curve fitting technique to fit the following equation over a predetermined dimensional range:

$$K_{f/fmn} = b_0 + b_1 * B + b_2 * B^2 + b_3 * B^3 + a_1 * A$$

where $K_{f/fmn}$ are the fundamental to spurious mode ratios and the coefficients a and b are determined for each $K_{f/fmn}$ over the predetermined dimensional range.

4. A double ended tuning fork (DETF) comprising:

a pair of spaced apart vibrating beams, generally parallel and joined together at opposing ends, each beam having a thickness t, width w, length m, said DETF having a length L wherein the dimensions for t, w, m and L are selected using a finite element model to satisfy the following relationship:

$$2f/f_{p2} = \left[ \frac{0.726 * B^2 * (1+S)}{A * (1 + 0.49 * S(B^2/A^2))} \right] * K_{f/fp2}(A,B) \neq 1$$

where $K_{f/fp2}(A,B) \neq 1$; $A=t/w$; $B=L/m$ and S is the sensitivity of the DETF over a predetermined operating range and the coefficient $K(A,B)$ is selected using a polynomial curve fitting technique to fit the following equation over a predetermined dimensional range:

$$K_{f/fmn} = b_0 + b_1 * B + b_2 * B^2 + b_3 * B^3 + a_1 * A$$

where $K_{f/fmn}$ are the fundamental to spurious mode ratios and the coefficients a and b are determined for each $K_{f/fmn}$ over the predetermined dimensional range.

5. A double ended tuning fork (DETF) comprising:

a pair of spaced apart vibrating beams, generally parallel and joined together at opposing ends, each beam having a thickness t, width w, length m, said DETF having a length L wherein the dimensions for t, w, m and L are selected using a finite element model to satisfy the following relationship:

$$2f/f_{p3} = \left[ \frac{0.185 * B^2 * (1+S)}{A * (1 + 0.27 * S(B^2/A^2))} \right] * K_{f/fp3}(A,B) \neq 1$$

where $K_{f/fp3}(A,B) \neq 1$; $A=t/w$; $B=L/m$ and S is the sensitivity of the DETF over a predetermined operating range and the coefficient $K(A,B)$ is selected using a polynomial curve fitting technique to fit the following equation over a predetermined dimensional range:

$$K_{f/fmn} = b_0 + b_1 * B + b_2 * B^2 + b_3 * B^3 + a_1 * A$$

where $K_{f/fmn}$ are the fundamental to spurious mode ratios and the coefficients a and b are determined for each $K_{f/fmn}$ over the predetermined dimensional range.

6. A double ended tuning fork (DETF) comprising:

a pair of spaced apart vibrating beams, generally parallel and joined together at opposing ends, each beam having a thickness t, width w, length m, said DETF having a length L wherein the dimensions for t, w, m and L are selected using a finite element model to satisfy the following relationship:

$$2f/f_{p3} = \left[ \frac{0.370 * B^2 * (1+S)}{A * (1 + 0.27 * S(B^2/A^2))} \right] * K_{f/fp3}(A,B) \neq 1$$

where $K_{f/fp3}(A,B) \neq 1$; $A=t/w$; $B=L/m$ and S is the sensitivity of the DETF over a predetermined operating range and the coefficient $K(A,B)$ is selected using a polynomial curve fitting technique to fit the following equation over a predetermined dimensional range:

$$K_{f/fmn} = b_0 + b_1 * B + b_2 * B^2 + b_3 * B^3 + a_1 * A$$

where $K_{f/fmn}$ are the fundamental to spurious mode ratios and the coefficients a and b are determined for each $K_{f/fmn}$ over the predetermined dimensional range.

7. A double ended tuning fork (DETF) comprising:

a pair of spaced apart vibrating beams, generally parallel and joined together at opposing ends, each beam having a thickness t, width w, length m, said DETF having a length L wherein the dimensions for t, w, m and L are selected using a finite element model to satisfy the following relationship:

$$f/f_d = \left[ \frac{(1+S)}{A * (1 + S/A^2)} \right] * K_{f/fd}(A,B) \neq 1$$

where $K_{f/fd}(A,B) \neq 1$; $A=t/w$; $B=L/m$ and S is the sensitivity of the DETF over a predetermined operating range and the coefficient $K(A,B)$ is selected using a polynomial curve fitting technique to fit the following equation over a predetermined dimensional range:

$$K_{f/fmn} = b_0 + b_1 * B + b_2 * B^2 + b_3 * B^3 + a_1 * A$$

where $K_{f/fmn}$ are the fundamental to spurious mode ratios and the coefficients a and b are determined for each $K_{f/fmn}$ over the predetermined dimensional range.

8. A double ended tuning fork (DETF) comprising:

a pair of spaced apart vibrating beams, generally parallel and joined together at opposing ends, each beam having a thickness t, width w, length m, said DETF having a length L wherein the dimensions for t, w, m and L are selected using a finite element model to satisfy the following relationship:

$$2f/f_d = \left[ \frac{2 * (1+S)}{A * (1 + S/A^2)} \right] * K_{f/fd}(A,B) \neq 1$$

where $K_{f/f2d}(A,B) \neq 1$; $A=t/w$; $B=L/m$ and S is the sensitivity of the DETF over a predetermined operating range and the coefficient $K(A,B)$ is selected using a polynomial curve fitting technique to fit the following equation over a predetermined dimensional range:

$$K_{f/fmn} = b_0 + b_1 * B + b_2 * B^2 + b_3 * B^3 + a_1 * A$$

where $K_{f/fmn}$ are the fundamental to spurious mode ratios and the coefficients a and b are determined for each $K_{f/fmn}$ over the predetermined dimensional range.

9. A double ended tuning fork (DETF) comprising:

a pair of spaced apart vibrating beams, generally parallel and joined together at opposing ends, each beam having a thickness t, width w, length m, said DETF having a length L wherein the dimensions for t, w, m and L are selected using a finite element model to satisfy the following relationship:

$$f/f_{2d} = \frac{0.363 * (1+S)}{A * (1+S/A^2)} * K_{ff2d}(A,B) \neq 1$$

where A=t/w; B=L/m and S is the sensitivity of the DETF over a predetermined operating range and the coefficient K(A,B) is selected to fit the following equation over a predetermined dimensional range:

$$K_{ffmn} = b_0 + b_1*B + b_2*B^2 + b_3*B^3 + a_1*A$$

where $K_{ffmn}$ are the fundamental to spurious mode ratios and the coefficients a and b are determined for each $K_{ffmn}$ over the predetermined dimensional range.

10. A double ended tuning fork (DETF) comprising:

a pair of spaced apart vibrating beams, generally parallel and joined together at opposing ends, each beam having a thickness t, width w, length m, said DETF having a length L wherein the dimensions for t, w, m and L are selected using a finite element model to satisfy the following relationship:

$$2f/f_{2d} = \frac{0.726 * (1+S)}{A * (1+S/A^2)} * K_{ff2d}(A,B) \neq 1$$

where A=t/w; B=L/m and S is the sensitivity of the DETF over a predetermined operating range and the coefficient K(A,B) is selected to fit the following equation over a predetermined dimensional range:

$$K_{ffmn} = b_0 + b_1*B + b_2*B^2 + b_3*B^3 + a_1*A$$

where $K_{ffmn}$ are the fundamental to spurious mode ratios and the coefficients a and b are determined for each $K_{ffmn}$ over the predetermined dimensional range.

11. A double ended tuning fork (DETF) comprising:

a pair of spaced apart vibrating beams, generally parallel and joined together at opposing ends, each beam having a thickness t, width w, length m, said DETF having a length L wherein the dimensions for t, w, m and L are selected using a finite element model to satisfy the following relationships:

$$f/f_{p1} = \left[\frac{B^2 * (1+S)}{A * (1+S(B^2/A^2))}\right] * K_{ffp1} \neq 1;$$

$$2f/f_{p1} = \left[\frac{2 * B^2 * (1+S)}{A * (1+S(B^2/A^2))}\right] * K_{ffp1}(A,B) \neq 1;$$

$$\Delta f/f_{p2} = \left[\frac{0.363 * B^2 * (1+S)}{A * (1+0.49 * S(B^2/A^2))}\right] * K_{ffp2}(A,B) \neq 1;$$

$$2\Delta f/f_{p2} = \left[\frac{0.726 * B^2 * (1+S)}{A * (1+0.49 * S(B^2/A^2))}\right] * K_{ffp2}(A,B) \neq 1;$$

$$\Delta f/f_{p3} = \left[\frac{0.185 * B^2 * (1+S)}{A * (1+0.27 * S(B^2/A^2))}\right] * K_{ffp3}(A,B) \neq 1;$$

$$2\Delta f/f_{p3} = \left[\frac{0.370 * B^2 * (1+S)}{A * (1+0.27 * S(B^2/A^2))}\right] * K_{ffp3}(A,B) \neq 1;$$

$$\Delta f/f_d = \left[\frac{(1+S)}{A * (1+S/A^2)}\right] * [K_{ffd}(A,B) - 1]; \text{ and}$$

$$2\Delta f/f_{p2} = \left[\frac{0.726 * B^2 * (1+S)}{A * (1+0.49 * S(B^2/A^2))}\right] * K_{ffp2}(A,B) \neq 1$$

where $K_{ffp}(A,B)$; $2K_{ffp1}(A,B)$; $K_{ffp2}(A,B)$; $2K_{ffp2}(A,B)$; $K_{ffp3}(A,B)$; $K_{ffp3}(A,B)$; $K_{ffd}(A,B)$ and $K_{ff2d} \neq 1$.

12. A double ended tuning fork (DETF) comprising:

a pair of spaced apart vibrating beams, generally parallel and joined together at opposing ends, each beam having a thickness t, width w, length m, said DETF having a length L wherein the dimensions for t, w, m and L are selected using a finite element model to satisfy the following relationships:

$$f/f_{2d} = \frac{0.363 * (1+S)}{A * (1+S/A^2)} * K_{ff2d}(A,B) \neq 1$$

$$2f/f_{2d} = \frac{0.726 * (1+S)}{A * (1+S/A^2)} * K_{ff2d}(A,B) \neq 1$$

where A=t/w; B=L/m and S is the sensitivity of the DETF over a predetermined operating range and the coefficient K(A,B) is selected to fit the following equation over a predetermined dimensional range:

$$K_{ffmn} = b_0 + b_1*B + b_2*B^2 + b_3*B^3 + a_1*A$$

where $K_{ffmn}$ are the fundamental to spurious mode ratios and the coefficients a and b are determined for each $K_{ffmn}$ over the predetermined dimensional range.

* * * * *

UNITED STATES PATENT AND TRADEMARK OFFICE
CERTIFICATE OF CORRECTION

PATENT NO.    : 5,668,329

DATED         : Sep. 16, 1997

INVENTOR(S)   : Petri, Fred

It is certified that error appears in the above-identified patent and that said Letters Patent is hereby corrected as shown below:

Column 10, before equation 54: delete [(45)] after "equation" and substitute therefor --(53)--.

Claims 1-12: delete each occurrence of [ * ] and substitute therefor -- * --.

Claim 11, after "to satisfy the following relationships:", the first formula should appear as follows:

$$\Delta f / f_{p1} = \left[ \frac{B^2 * (1+S)}{A * \left(1 + S\left(B^2 / A^2\right)\right)} \right] * \left[ K_{f/f_{p1}}(A,B) - 1 \right]$$

Claim 11, after "to satisfy the following relationships:", the second formula should appear as follows:

$$2\Delta f / f_{p1} = \left[ \frac{2 * B^2 * (1+S)}{A * \left(1 + S\left(B^2 / A^2\right)\right)} \right] * \left[ K_{f/f_{p1}}(A,B) - 1 \right]$$

UNITED STATES PATENT AND TRADEMARK OFFICE
CERTIFICATE OF CORRECTION

PATENT NO.  : 5,668,329

DATED       : Sep. 16, 1997

INVENTOR(S) : Petri, Fred

It is certified that error appears in the above-identified patent and that said Letters Patent is hereby corrected as shown below:

Claim 11, after "to satisfy the following relationships:", the third formula should appear as follows:

$$\Delta f / f_{p2} = \left[ \frac{0.363 * B^2 * (1+S)}{A * \left(1 + 0.49 * S(B^2 / A^2)\right)} \right] * \left[ K_{f/f_{p2}}(A, B) - 1 \right]$$

Claim 11, after "to satisfy the following relationships:", the fourth formula should appear as follows:

$$2\Delta f / f_{p2} = \left[ \frac{0.726 * B^2 * (1+S)}{A * \left(1 + 0.49 * S(B^2 / A^2)\right)} \right] * \left[ K_{f/f_{p2}}(A, B) - 1 \right]$$

Claim 11, after "to satisfy the following relationships:", the fifth formula should appear as follows:

$$\Delta f / f_{p3} = \left[ \frac{0.185 * B^2 * (1+S)}{A * \left(1 + 0.27 * S(B^2 / A^2)\right)} \right] * \left[ K_{f/f_{p3}}(A, B) - 1 \right]$$

Claim 11, after "to satisfy the following relationships:", the sixth formula should appear as follows:

$$2\Delta f / f_{p3} = \left[ \frac{0.370 * B^2 * (1+S)}{A * \left(1 + 0.27 * S(B^2 / A^2)\right)} \right] * \left[ K_{f/f_{p3}}(A, B) - 1 \right]$$

UNITED STATES PATENT AND TRADEMARK OFFICE
CERTIFICATE OF CORRECTION

PATENT NO. : 5,668,329

DATED : Sep. 16, 1997

INVENTOR(S) : Petri, Fred

It is certified that error appears in the above-identified patent and that said Letters Patent is hereby corrected as shown below:

Claim 11, after "to satisfy the following relationships:", the eighth formula should appear as follows:

$$2\Delta f / f_d = \left[ \frac{0.726 * (1 + S)}{A * (1 + S / A^2)} \right] * \left[ K_{f1/f2d}(A, B) - 1 \right]$$

Signed and Sealed this

Second Day of June, 1998

Attest:

Attesting Officer

BRUCE LEHMAN

Commissioner of Patents and Trademarks